United States Patent [19]

Greskovich et al.

[11] Patent Number: 5,057,692
[45] Date of Patent: Oct. 15, 1991

[54] HIGH SPEED, RADIATION TOLERANT, CT SCINTILLATOR SYSTEM EMPLOYING GARNET STRUCTURE SCINTILLATORS

[75] Inventors: Charles D. Greskovich; William P. Minnear, both of Schenectady; Joseph P. Chernoch, Scotia, all of N.Y.; David M. Hoffman, New Berlin; Robert J. Riedner, Waukesha, both of Wis.

[73] Assignee: General Electric Company, Schenectady, N.Y.

[21] Appl. No.: 547,007

[22] Filed: Jun. 29, 1990

[51] Int. Cl.⁵ .............................. G01T 1/202
[52] U.S. Cl. ..................... 250/361 R; 250/363.04; 250/367; 250/483.1; 252/301.4 R; 378/19
[58] Field of Search .......... 250/483.1, 361 R, 363.04, 250/367; 252/301.4 R; 378/19

[56] References Cited

U.S. PATENT DOCUMENTS

| | | | |
|---|---|---|---|
| 4,298,820 | 11/1981 | Bongers et al. | 313/463 |
| 4,413,280 | 11/1983 | Adlerstein et al. | 358/111 |
| 4,421,671 | 12/1983 | Cusano et al. | 252/301.4 F |
| 4,466,929 | 8/1984 | Greskovich et al. | 264/1.2 |
| 4,466,930 | 8/1984 | Greskovich et al. | 264/1.2 |
| 4,473,513 | 9/1984 | Cusano et al. | 264/1.2 |
| 4,518,545 | 5/1985 | Greskovich et al. | 264/1.2 |
| 4,518,546 | 5/1985 | Greskovich et al. | 264/1.2 |
| 4,525,628 | 6/1985 | DiBianca et al. | 250/367 |
| 4,571,312 | 2/1986 | Greskovich et al. | 264/1.2 |
| 4,747,973 | 5/1988 | Cusano et al. | 252/301.4 R |
| 4,783,596 | 11/1988 | Riedner et al. | 250/483.1 |
| 4,802,180 | 1/1989 | Brandle, Jr. et al. | 372/41 |
| 4,822,698 | 4/1989 | Lammers et al. | 428/690 |

FOREIGN PATENT DOCUMENTS 3704813 8/1988 Fed. Rep. of Germany.

*Primary Examiner*—Constantine Hannaher
*Attorney, Agent, or Firm*—Marvin Snyder; James C. Davis, Jr.

[57] ABSTRACT

Selected scintillator materials provided in transparent block form for use in systems such as CT scanning systems employ a garnet host material for an activator ion which provides the desired luminescence. The garnet host material preferably includes gadolinium as one of its components in order to provide a transparent host material in bar form which has a high x-ray stopping power (where the radiation to be detected is x-ray radiation). Chromium, cerium and neodymium are preferred activator materials.

26 Claims, 11 Drawing Sheets

HIGH SPEED, RADIATION TOLERANT, CT SCINTILLATOR SYSTEM EMPLOYING GARNET STRUCTURE SCINTILLATORS

RELATED APPLICATIONS

This application is related to application Ser. No. 07/547,006 entitled "Transparent Polycrystalline Garnets" by C.D. Greskovich et al. and application Ser. No. 07/546,824 entitled "Hole-Trap-Compensated Scintillator Material", by V.G. Tsoukala, et al. each of which is being filed concurrently herewith and is incorporated herein by reference in its entirety.

BACKGROUND OF THE INVENTION

1. Field of the Invention

The present invention relates to the field of solid luminescent scintillators, and more particularly, to the field of x-ray sensitive, solid luminescent scintillators suitable for use in high speed computed tomography (CT) scanning systems, particularly medical CT systems.

2. Background Information

A luminescent material absorbs energy in one portion of the electromagnetic spectrum and emits energy in another portion of the electromagnetic spectrum. A luminescent material in powder form is commonly called a phosphor, while a luminescent material in the form of a transparent solid body is commonly called a scintillator.

Most useful phosphors emit radiation in the visible portion of the spectrum in response to the absorption of the radiation which is outside the visible portion of the spectrum. Thus, the phosphor performs the function of converting electromagnetic radiation to which the human eye is not sensitive into electromagnetic radiation to which the human eye is sensitive. Most phosphors are responsive to more energetic portions of the electromagnetic spectrum than the visible portion of the spectrum. Thus, there are powder phosphors which are responsive to ultraviolet light (as in fluorescent lamps), electrons (as in cathode ray tubes) and x-rays (as in radiography).

Two broad classes of luminescent materials are recognized. These are self-activated luminescent materials and impurity-activated luminescent materials.

A self-activated luminescent material is one in which the pure crystalline host material upon absorption of a high energy photon elevates electrons to an excited state from which they return to a lower energy state by emitting a photon. Self-activated luminescent materials normally have a broad spectrum emission pattern because of the relatively wide range of energies which the electron may have in either the excited or the lower energy states with the result that any given excited electron may emit a fairly wide range of energy during its transition from its excited to its lower energy state, depending on the particular energies it has before and after its emissive transition.

An impurity activated luminescent material is normally one in which a non-luminescent host material has been modified by inclusion of an activator species which is present in the host material in a relatively low concentration such as in the range from about 200 parts per million 1,000 ppm. However, some phosphors require several mole percent of activator ions for optimized light output. With an impurity activated luminescent material, the host crystal absorbs the incident photon and the absorbed energy may be accommodated by the activator ions or it may be transferred by the lattice to the activator ions. One or more electrons of the activator ions are raised to a more excited state. These electrons, in returning to their less excited state, emit a photon of luminescent light. In many commonly employed impurity activated luminescent materials, the electrons which emit the luminescent light are d or f shell electrons whose energy levels may be significantly affected or relatively unaffected, respectively, by the surrounding crystal field. In those situations where the activator ion is not much affected by the local crystal field, the emitted luminescent light is substantially characteristic of the activator ions rather than the host material and the luminescent spectrum comprises one or more relatively narrow emission peaks. This contrasts with a self-activated luminescent material's much broader emission spectrum. In those situations where the electron energies of the activator ions are significantly affected by the crystal structure, the luminescent spectrum is normally a fairly broad one similar to that of a self-activated luminescent material. The host material of an impurity activated luminescent material normally has many other uses in which no activating species is present. In some of those uses, that host material may include other species to modify its properties, and may even include constituents which are luminescent activators, but which are included in the composition because of non-luminescent characteristics which they impart to that composition.

There are a vast number of known phosphors each of which has its own set of properties such as the turn-on delay, efficiency, primary decay time, afterglow, hysteresis, luminescent spectrum, radiation damage and so forth. The turn-on delay of a luminescent material is the time period between the initial impingement of stimulating radiation on the luminescent material and the luminescent output reaching its maximum value, for a constant intensity of stimulating radiation. The efficiency of a luminescent material is the percentage of the energy of the absorbed stimulating radiation which is emitted as luminescent light. When the stimulating radiation is terminated, the luminescent output from a scintillator decreases in two stages. The first of these stages is a rapid decay from the full luminescent output to a low, but normally non-zero, value at which the slope of the decay changes to a substantially slower decay rate. This low intensity, normally long decay time luminescence, is known as afterglow and usually occurs with intensity values less than 2% of the full intensity value. The initial, rapid decay is known as the primary decay or primary speed and is measured from the time at which the stimulating radiation ceases to the time at which the luminescent output falls to 1/e of its full intensity value.

A luminescent material exhibits hysteresis if the amount of luminescent light output for a given amount of incident stimulating radiation depends upon the amount of stimulating radiation which has been recently absorbed by the luminescent material. The luminescent spectrum of a luminescent material is the spectral characteristics of the luminescent light which is emitted by that material.

Radiation damage is the characteristic of a luminescent material in which the quantity of light emitted by the luminescent material in response to a given intensity of stimulating radiation changes after the material has been exposed to a high radiation dose. Radiation damage may be measured by first stimulating a luminescent material with a known, standard or reference, intensity of radiation. The initial output ($I_o$) of the photodetector in response to this reference intensity of incident stimulating radiation is measured and recorded or stored. Next, the luminescent material is exposed to a high dosage of radiation. Finally, the luminescent material is immediately again exposed to the reference intensity of stimulating radiation and the final output ($I_f$) of its photodetector, in response to this reference intensity of stimulating radiation, is measured and stored or recorded. The radiation damage (RD) may then be expressed as:

$$RD = \frac{I_f - I_o}{I_o} \tag{1}$$

Ideally, the radiation damage should be as small as possible. In most luminescent materials, it is a negative number because $I_f$ is normally less than $I_o$. However, if the afterglow magnitude is $\geq 0.1\%$ at $\sim 100$ milliseconds after cessation of x-radiation, then unreliable and positive numbers for radiation damage may be obtained.

In phosphors for use in radiography, many of these characteristics can vary over a wide range without adversely affecting overall system performance. In other applications, each of these characteristics must be strictly specified to obtain maximum or practical performance.

In a computed tomography (CT) scanning system, an x-ray source and an x-ray detector array are positioned on opposite sides of the subject and rotated around the subject in fixed relation to each other. Early CT scanning systems employed xenon gas as their x-ray detection medium. In these systems, incident x-rays ionize the xenon gas and the resulting ions are attracted to charged plates at the edge of the cell and the scintillator output is a charge or current. More recently, CT scanners with solid scintillators have been introduced. In a solid scintillator system, the scintillator material of a cell or element absorbs x-rays incident on that cell and emits light which is collected by a photodetector for that cell. During data collection, each cell or element of the detector array provides an output signal representative of the present light intensity in that cell of the array. These output signals are processed to create an image of the subject in a manner which is well known in the CT scanner art. It is desirable for the luminescent material in a CT scanner to have a linear characteristic in which the light output is a linear function of the amount of stimulating radiation which is absorbed in order that light output may be directly converted to a corresponding intensity of stimulating radiation in a linear manner.

In systems such as CT scanners, the luminescent material must have many specialized characteristics which are not needed in many of the previously mentioned phosphor based systems. First, in x-ray based CT systems, it is desirable to absorb substantially all of the incident x-rays in the luminescent material in order to minimize the x-ray dose to which the patient must be exposed in order to obtain the computed tomography image. In order to collect substantially all of the incident x-rays, the luminescent material must have a thickness in the direction of x-ray travel which is sufficient to stop substantially all of the x-rays. This thickness depends both on the energy of the x-rays and on the x-ray stopping power of the luminescent material. Second, it is important that substantially all of the luminescent light be collected by the photosensitive detector in order to maximize overall system efficiency, the signal to noise ratio and the accuracy with which the quantity of incident stimulating radiation may be measured. In order to extract substantially all of the luminescent light generated in the luminescent material of the CT scanner, the luminescent material should be transparent to the luminescent light. Otherwise much of the luminescent light will not reach the photosensitive detector because of scattering and absorption within the luminescent material. Consequently, the luminescent material is provided in the form of a solid bar which is substantially transparent to the luminescent light and which is thick enough in the direction of x-ray travel to absorb substantially all of the incident x-rays. This complicates both the selection of a luminescent material for use in CT scanning and its preparation since many materials which are known to luminesce and which have been used or tested as powder phosphors cannot be provided in the form of a solid bar having the necessary transparency.

The luminescent properties of materials have not been tabulated in handbooks in the manner in which the melting point, boiling point, density and other more mundane physical characteristics of various compounds have been tabulated. Most luminescent data is found in articles with respect to particular materials which the authors have measured for one reason or another. Further, most characterization of luminescent materials has been done using ultraviolet (UV) light as the stimulating radiation because ultraviolet light is more easily produced than x-rays and is generally considered less harmful. Unfortunately, there are a number of materials which are luminescent in response to ultraviolet light stimulation which are not luminescent in response to x-ray stimulation. Consequently, for many materials, even that luminescent data which is available provides no assurance that the material will luminesce in response to x-ray stimulation. Further, for many applications of phosphors many of the parameters which must be closely controlled in a scintillator for use in a state-of-the-art CT scanning system are unimportant and thus have not been measured or reported. Consequently, existing luminescent material data provides little, if any, guidance in the search for a scintillator material appropriate for use in a state-of-the-art CT scanning system. Among the parameters on which data is generally unavailable are radiation damage in response to x-ray stimulation, afterglow, susceptibility to production in single crystalline form, hysteresis phenomena, mechanical quality and in many cases, even whether they are x-ray luminescent. The large number of parameters which must meet strict specifications in order for a given material to be suitable for use in a state-of-the-art CT scanner, including the ability to provide the material in the form of transparent scintillator bodies, makes the process of identifying a suitable scintillator material one which essentially begins from scratch and is akin to searching for "a needle in a haystack". The difficulty of identifying such a material is exemplified by the use of cesium iodide activated with thallium and cadmium tungstate in CT scanning machines presently being marketed despite the fact that each of these materials has a number of characteristics (discussed below) which are considered undesirable for a state-of-the-art CT scanner scintillator.

There are several reasons that it is desirable that the radiation damage be as small as possible. One disadvantage of high radiation damage is that as radiation damage accumulates, the sensitivity of the system decreases because of the progressively smaller quantity of light which is emitted by the scintillator material for a given stimulating dosage of radiation. Another disadvantage is that for too high a radiation damage, the scintillation detectors must eventually be replaced because of the cumulative effects of the radiation damage. This results in a substantial capital cost for the replacement of the scintillation detecting system. A more bothersome, and potentially even more expensive effect of high radiation damage is a need to recalibrate the system frequently during the working day, and potentially as frequently as after every patient. Such recalibration takes time and also exposes the scintillator material to additional radiation which contributes further damage. It is considered desirable that the radiation damage of a scintillator material for use in a CT scanning system be small enough that calibration of the system at the beginning of each working day is sufficient to ensure accurate results throughout the working day.

One way of providing the luminescent material in the form of a transparent bar is to employ a single crystalline luminescent material which is transparent to its own luminescent radiation. A common method of growing single crystals is the Czochralski growth technique in which appropriate source materials are placed in a high temperature crucible which is often made of iridium (Ir) and the crucible and its contents are heated to above the melting point of the desired single crystalline material. The resulting molten material is known as the melt. During growth, the melt temperature is held at a value at which the upper portion of the melt is cool enough for single crystalline material to grow on a seed crystal brought into contact with the melt, but not to spontaneously nucleate. A seed crystal of the desired material or one on which the desired material will grow as a single crystal is lowered into contact with the top of the melt. As the desired crystalline material grows on the seed crystal, the seed crystal is withdrawn (pulled upward) at a rate which maintains the growing boule of single crystalline material at a desired diameter. Typically, the seed crystal is rotated during growth to enhance the uniformity of the growing crystal. The source material which is initially placed in the crucible may take any appropriate form, but is normally a mixture of appropriate quantities of source materials which together provide a melt having the stoichiometry and impurity control desired for the single crystalline material to be grown.

When a pure crystal is grown from a corresponding melt, the Czochralski growth technique normally provides a high quality, uniform composition single crystal of the desired composition. When it is desired to produce a crystal having substitutions for some portion of the atoms of the pure crystalline material, the growth dynamics are more complex and the manner in which the substituent enters into the crystal structure and thus its concentration in the melt and boule as functions of time depend on a number of characteristics. One of the effects of these characteristics is characterized as the segregation coefficient. The segregation coefficient has a value of 1 when the substituent is normally present in the solid boule in the same ratio as it is present in the source melt. The segregation coefficient is greater than 1 when the substituent is normally present in the solid boule in greater concentration than it is present in the source melt and the segregation coefficient is less than 1 when the substituent is normally present in the solid boule in lesser concentrations than it is present in the melt. While there are a number of different fundamental reasons for these differences, the segregation coefficient is an effective means of expressing the result.

Where slabs or bars of the single crystalline material are desired, the Czochralski-grown single crystalline boule is sliced into wafers and then into bars of the desired configuration. The only two single crystalline luminescent materials known to be in use in commercial CT scanning systems are cesium iodide (CsI) and cadmium tungstate ($CdWO_4$). The cesium iodide is thallium (Tl) activated while the cadmium tungstate is a pure, self-activated luminescent material. CsI produces a luminescence output having a peak emission at about 550 nm and exhibits appreciable hysteresis and radiation damage. $CdWO_4$ produces a luminescence output having a peak at about 540 nm and exhibits high radiation damage, although to a lesser extent than CsI. The radiation damage with CsI is severe enough, that recalibration of the system between patients is often desirable. While the radiation damage in $CdWO_4$ is less than that, recalibration more than once a day is considered desirable. As a consequence of these radiation damage characteristics, systems which employ either of these materials as their scintillating material suffer from a decrease in sensitivity as radiation damage accumulates and must eventually have their scintillator system replaced.

In a CT scanning system, one of the crucial characteristics of a scintillator bar is its Z-axis response curves. Individual scintillator bars are normally narrow for maximum resolution and deeper than wide to provide adequate x-ray stopping power and relatively long perpendicular to the plane of the x-ray beam/scintillator system in order to collect sufficient x-rays to be efficient. The Z-axis characteristic is the photodetector output in response to a constant intensity, narrow, x-ray stimulating beam as that beam is scanned from one Z-direction end of the scintillator bar to the other. Ideally, this characteristic is symmetric about the longitudinal center of the scintillator bar and increases monotonically from each end to the center. The increase in output near the ends of the bar is preferably complete once the entire Z-direction thickness of the beam is disposed on the scintillator bar, with the output being substantially uniform along the intervening portion of the bar.

In order to meet these Z-axis requirements, the scintillator bar must have substantially uniform optical, luminescent and source radiation absorption properties along its entire length. For single crystal, impurity-activated scintillator bars, this requires the ability to grow source boules having uniform luminescent activator concentration both radially and lengthwise of the boule, since the luminescent output is dependent on the local concentration of the activator ion. Consequently, the process of selecting a scintillator material for a CT scanner, in addition to determining all of the other important properties of the material, must also include establishing the feasibility of producing scintillator bars with acceptable Z-axis characteristics.

In a CT scanner, it is preferable to provide a reflective surface on all surfaces of the scintillator bar other than the surface along which the photodetector diode is disposed. Thus, a typical solid scintillation detector system comprises a plurality of individual scintillator bars positioned side-by-side with an individual photodetector diode coupled to each scintillator bar to convert its luminescent light into a corresponding electrical signal. It is important in such a system that all of the scintillator bars have similar overall conversion efficiencies (that is, substantially identical electrical output signals for identical incident x-ray radiation). This places another limitation on the selection of the scintillator material in that it must be possible to produce a sufficient quantity of scintillator bars having similar characteristics to assemble a scintillation detector having as many as 1,000 or more elements.

The primary decay time determines how fast a CT scanner can scan a patient since it is necessary for the luminescent output in response to radiation incident in one position of the scanner to have ceased before the luminescent output at another position of the scanner can be accurately measured. At present, a primary decay time of less than 500 microseconds is preferred, with still lower values being more desirable if they can be obtained without undesirable affects on other properties of the scintillator material such as maximum light output, radiation damage and hysteresis. It is also desirable that the maximum afterglow level be very small and that it decay relatively rapidly. For modern CT scanners, afterglow may be measured at 100 to 150 milliseconds after stimulating radiation termination and again at 300 milliseconds to characterize a scintillator material. An afterglow of less than 0.1% is considered highly desirable since the photodetector cannot distinguish between luminescent light which is a result of afterglow from earlier stimulation and luminescent light which is a result of present stimulation. Thus, afterglow can limit the intensity resolution of a CT scanner system.

For purposes of comparing the efficiency of different candidate scintillator materials, it is convenient to normalize light output. The amplitude of the output signal from a photodetector diode in response to stimulation of a standard sized scintillator bar of the candidate material with an established reference intensity of x-rays is compared with the output produced by cadmium tungstate of the same configuration in response to the same stimulation. Cadmium tungstate is a convenient standard because the self-activated nature of its luminescence results in substantially fixed light output for a given intensity of stimulating radiation so long as it has not been heavily radiation damaged, since its light output does not depend on the concentration of an activator. Thus, light output data taken by different individuals and at different times can be directly compared without having to first establish the calibration of different test setups.

It is desirable to have computed tomography scanning systems operate as fast as possible to maximize the number of patients which can be examined by a computed tomography scanner each working day and because the shorter time a scan takes, the easier it is for a patient to hold still during the scan. Further, the movement of internal organs is minimized.

As the scanning speed of a CT system is increased, the signal amplitude decreases for a fixed x-ray dose rate. Consequently, the signal-to-noise ratio, the contrast and thus the useful intensity resolution will decrease unless system parameters are adjusted to reduce noise. In order to reduce noise, the primary decay time of the scintillator should be reduced to a value where it does not contribute noise to the system. The afterglow should also be reduced as much as possible, since it provides a background luminescence intensity which is a noise contribution to the photodetector output. Selecting a scintillator material having its peak output in the vicinity of the peak sensitivity of the photodetector has the effect of reducing noise by increasing signal amplitude. Other modifications can also assist in maintaining the signal-to-noise ratio.

As the CT scanner field has matured, the speed of the electronics has increased, thus making faster scintillators desirable in order that a data scan may be performed in less time. It is now desired to operate CT scanning systems at speeds which require scintillators which are much faster than what was required as little as five years ago. Consequently, there is a vast lack of data about known solid luminescent materials which would be needed in order to select and make a scintillator material which is appropriate for use in a state-of-the-art CT scanning system where high speed electronics must be matched by a still higher speed scintillation material.

Separate from the problem of determining all these characteristics for individual candidate materials, is the problem that in a scintillation scanner, material must be provided in the form of a transparent solid body. Many luminescent materials which can be provided in powder form cannot be provided in a single crystalline form and thus are not available as transparent bodies. This inability to produce particular luminescent materials as single crystalline material can be a result of incompatibility of crystal structures, instability at Czochralski growth temperatures, low solubility of some components of a luminescent material in the crystal structure or the melt, a segregation coefficient which results in a non-uniform distribution within the boule of the additives and/or substituents or other reasons. Consequently, even if a particular luminescent composition is identified as apparently having desirable properties for use in a scintillation detector of a computed tomography machine, production of such a scintillator detector is not straightforward. In many cases, the desired composition cannot be produced as a single crystalline material.

Scintillation counters are used to count high energy particles, in physics research. These scintillation counters normally comprise a solid transparent body (often a plastic with a luminescent material dispersed in it) which is coupled to a photomultiplier tube to detect the very faint luminescence produced by absorption of a single particle. The materials used for such scintillation counters must have a very short primary decay time (preferably much less than 100 nanoseconds) in order to distinguish separate, but closely spaced-in-time events from each other in order that the desired counting may take place. The other characteristics which are important to the use of a material as the scintillator in a CT scanning system are of little consequence in the scintillation counter art so long as the afterglow is low enough that a new primary scintillation can be distinguished from any background afterglow resulting from previous events. These scintillation counters can use luminescent materials whose afterglow would present a problem in the CT scanning art. Consequently, although work has been done on scintillation materials for use in scintillation counting applications, such work is only peripherally relevant to a search for a scintillation material for use in a CT scanning system.

There are a number of luminescent materials which can be produced by flux growth techniques as small single crystals, but which cannot be produced as large single crystals because they are unstable at high temperatures and decompose into constituent materials. Other luminescent materials have been produced as thin films in attempts to develop phosphors for projection cathode ray tubes in order to minimize light loss due to scattering in amorphous or polycrystalline films. Such materials have no utility for the scintillators of CT scanners in the absence of an ability to provide a transparent body having sufficient thickness (generally at least 1 mm thick) for the material to be effective at stopping the x-rays employed in a CT scanning system. Further, the reports of the development work done on these materials contain no data on many characteristics which are crucial to determining whether a material is suitable for use in a CT scanning system.

A polycrystalline alternative to the single crystalline scintillator materials cesium iodide and cadmium tungstate is disclosed in U.S. Pat. Nos. 4,421,671; 4,466,929; 4,466,930; 4,473,413; 4,518,545; 4,518,546; 4,525,628; 4,571,312; 4,747,973 and 4,783,596. The scintillator composition disclosed in these patents is a cubic yttrium gadolinium oxide doped with various rare earth elements to provide a scintillator material having desired luminescent properties. These materials have not been prepared in single crystalline form because of the difficulty of growing crystals with desired, uniform distribution of all of the necessary constituents. As is further disclosed in the above recited patents, a method was developed for providing this doped yttrium-gadolinium oxide scintillator material in a polycrystalline ceramic form in which it is sufficiently transparent to provide an excellent scintillator material. This material has the substantial advantage over the cesium iodide and cadmium tungstate of being essentially free of radiation damage and hysteresis as well as having a sufficiently low afterglow to satisfy the requirements for a high quality CT scanning system. Unfortunately, this material has a primary decay time on the order of 1,000 microseconds and thus is not as fast as is desired for present state-of-the-art CT scanning systems.

German patent DE 37 04 813 A1 describes a single crystal $Gd_{3-x}Ce_xAl_{5-y}Sc_yO_{12}$ scintillator prepared either by first spray drying a source sulphate solution and calcining the dried sulphate or mixing oxides—each followed by pressing, sintering, melting and pulling a single crystal in a high vacuum. A spectrum for the luminescent output from this material is also presented with its peak in the vicinity of 560 nm.

It would be desirable to have a scintillator which is fast, has a low afterglow, no hysteresis, no non-linearity in output, high x-ray stopping power, high light output for a given stimulating x-ray input and which emits light at a frequency where photodetector diodes are particularly sensitive.

OBJECTS OF THE INVENTION

Accordingly, a primary object of the present invention is to provide a CT scintillator detection system with a scintillator which is fast, has a low afterglow and has acceptable hysteresis, radiation damage and non-linearity in response to x-ray stimulation.

Another object of the present invention is to provide a CT scintillator detector with improved single crystalline scintillator material.

Still another object of the present invention is to provide a long life CT scintillator detector system which can operate at higher speeds than existing systems without radiation damage and other undesirable characteristics.

A further object of the present invention is to provide a CT scintillation detector having the desirable properties of high speed, high output, high x-ray stopping power and low afterglow combined with low values of the undesirable properties of hysteresis, non-linearity and radiation damage susceptibility.

SUMMARY OF THE INVENTION

Accordingly, the above and other objects which will become apparent from the specification as a whole, including the drawings, are accomplished by provision of a scintillating detector including an activated garnet as the scintillator material. In particular, gadolinium gallium garnet ($Gd_3Ga_5O_{12}$), gadolinium scandium gallium garnet ($Gd_3Sc_2Ga_3O_{12}$), gadolinium scandium aluminum garnet ($Gd_3Sc_2Al_3O_{12}$), each activated with chromium 3+ ions in a concentrations from about 0.07 to 0.6 wt% $Cr_2O_3$, yttrium aluminum garnet ($Y_3Al_5O_{12}$) activated with cerium 3+ ions at a concentration of about 0.33 wt% $Ce_2O_3$ or neodymium 3+ ions at a concentration of about 0.85 wt% $Nd_2O_3$ are particular examples of scintillator compositions which provide the benefits of high speed, high output, low afterglow, high x-ray stopping power, emission of light in the sensitive portion of a photodetector diode's characteristics and acceptable hysteresis, non-linearity and minimal radiation damage. Other garnet host compositions and other activators may also be employed. For simplicity, we shall denote $Gd_3Ga_5O_{12}$ as GGG, $Gd_3Sc_2Ga_3O_{12}$ as GSGG, $Gd_3Sc_2Al_3O_{12}$ as GSAG and $Y_3Al_5O_{12}$ as YAG.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
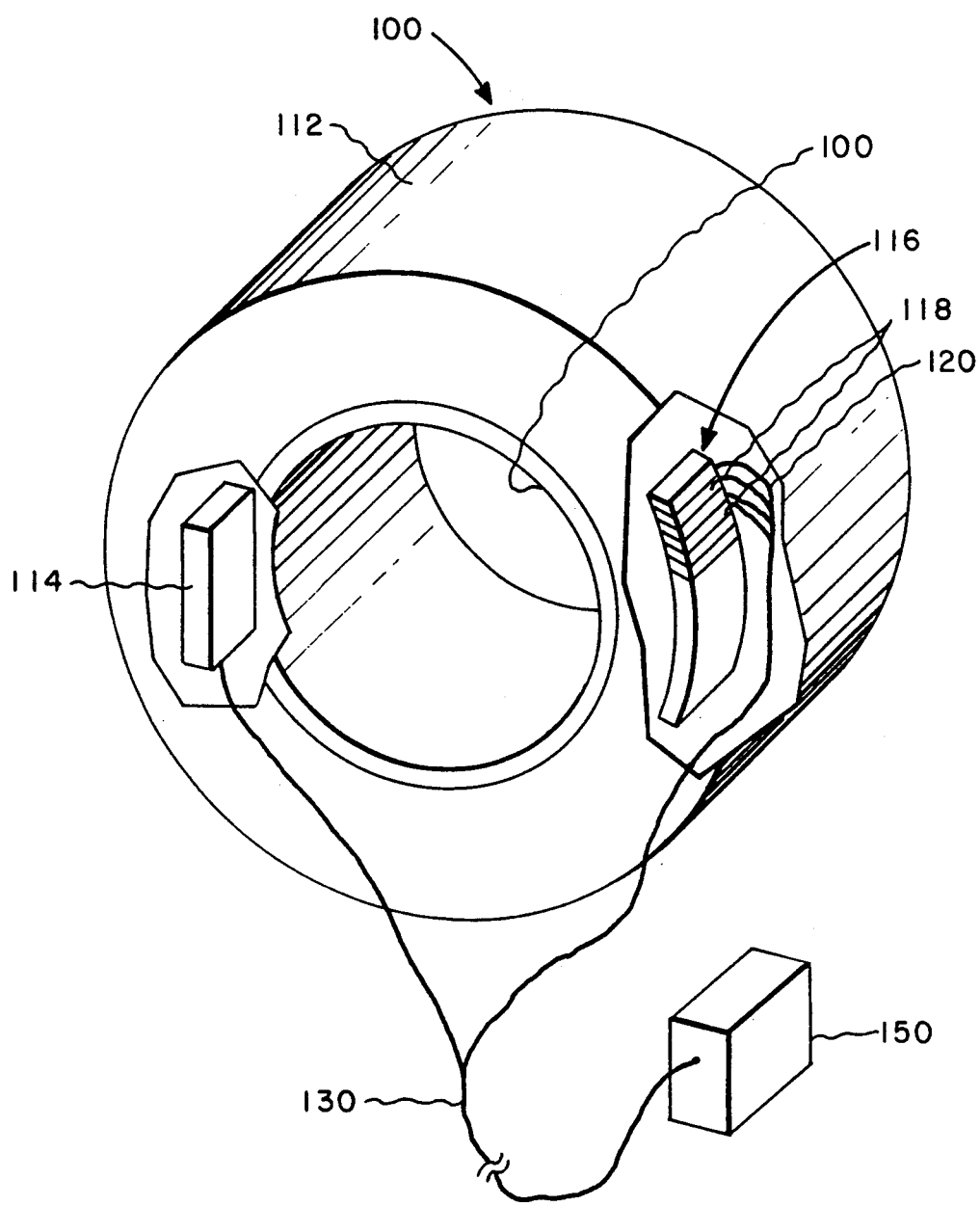
FIG. 1 is a schematic illustration of a CT system.

A computed tomography (CT) scanning system 100 is illustrated schematically in FIG. 1. This CT scanning system 100 comprises a cylindrical enclosure 110 in which the patient or object to be scanned is positioned. A gantry 112 surrounds the cylinder 110 and is configured for rotation about the cylinder's axis. The gantry 112 may be designed to revolve for one full revolution and then return or may be designed for continuous rotation, depending on the system used to connect the electronics on the gantry to the rest of the system. The electronics on the gantry include an x-ray source 114 which preferably produces a fan x-ray beam which encompasses a scintillation detector system 116 mounted on the gantry on the opposite side of the cylinder 110. The fan pattern of the x-ray source is disposed in the plane defined by the x-ray source and the scintillation detector system 116. The scintillation detector system 116 is very narrow or thin in the direction perpendicular to the plane of the x-ray fan beam. Each cell 118 of the scintillation detector system incorporates a solid transparent bar of scintillator material and a photodetector diode optically coupled to that scintillator bar. The output from each photodetector diode is connected to an operational amplifier which is mounted on the gantry. The output from each operational amplifier is connected either by individual wires 120 or by other electronics to the main control system 150 for the computed tomography system. In the illustrated embodiment, power for the x-ray source and signals from the scintillation detector are carried to the main control system 150 by a cable 130. The use of the cable 130 generally limits the gantry to a single full revolution before returning to its original position. Alternatively, slip rings or optical or radio transmission may be used to connect the gantry electronics to the main control system 150 where continuous rotation of the gantry is desired. In CT scanning systems of this type, the scintillator material is used to convert incident x-rays to luminescent light which is detected by the photodetector diode and thereby converted to an electrical signal as a means of converting the incident x-rays to electrical signals which may be processed for image extraction and other purposes. At present, one of the limitations on the capabilities of such systems is the characteristics of the scintillator compositions, whether they be xenon gas or bars of solid scintillator material.

We have identified a class of luminescent materials which are appropriate for use as scintillators in high speed x-ray CT scanning systems of the type illustrated in FIG. 1. In particular, they luminesce in response to x-ray stimulation, have primary decay times of less than 500 microseconds, have afterglow levels of less than 0.2% at 100 to 300 milliseconds after the cessation of x-ray stimulating radiation, exhibit radiation damage having a magnitude of less than 5% after an exposure to between 500 and 1,000 rads of x-rays, exhibit essentially no hysteresis and when grown as single crystals by the Czochralski technique, are reasonably transparent to their luminescent light and typically have light outputs which range from about 100% to about 350% of that produced by cadmium tungstate single crystal, a material used in commercial x-ray body scanners.

This class of scintillator material is based on activated luminescence of cubic garnet crystals. Garnets are a class of materials with the crystal chemical formula $A_3B_5O_{12}$ in which the A cations are eight-coordinated with oxygens and the B cations are either octahedrally (six) or tetrahedrally (four) coordinated with oxygens. The crystal structure is cubic with 160 ions per unit cell containing eight formula units. In accordance with the present invention, the A cations are rare earth or yttrium ions alone, in combinations and/or with activator substitutions. The B cations may be rare earth ions or other ions, again, alone, in combinations and/or with substitutions. In particular, we have found that with activator ions substituted in the eight-coordinated or six-coordinated sites, these garnets are luminescent in response to x-ray stimulation. A particularly important activator ion which we have discovered is x-ray luminescent in this host material is the chromium 3+ ion located in six-coordinated sites.

In accordance with one embodiment of this broad class of scintillator materials, a gadolinium gallium garnet (GGG) crystal is doped with chromium ions ($Cr^{3+}$) in a concentration in the range from less than about 0.05 wt% (weight percent) to more than about 0.22 wt% chromium oxide ($Cr_2O_3$) of the total composition of the gadolinium gallium garnet ($Gd_3Ga_5O_{12}$) or GGG. While pure GGG is colorless, this material has a greenish tint.

EXAMPLE

Figure 2:
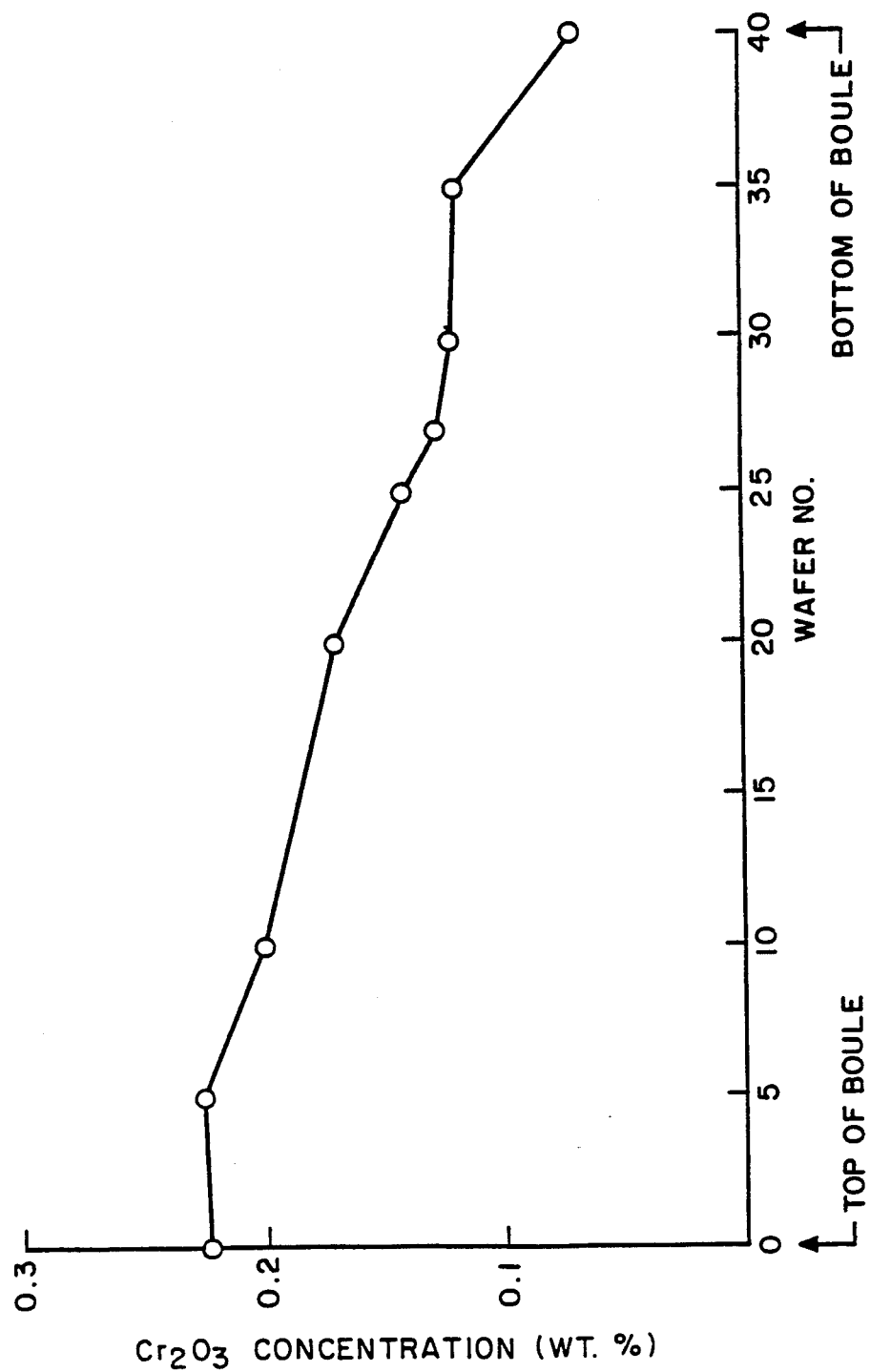
FIG. 2 is a graph of chromium concentration as a function of position along a single crystalline boule of chromium doped GGG.
Figure 3:
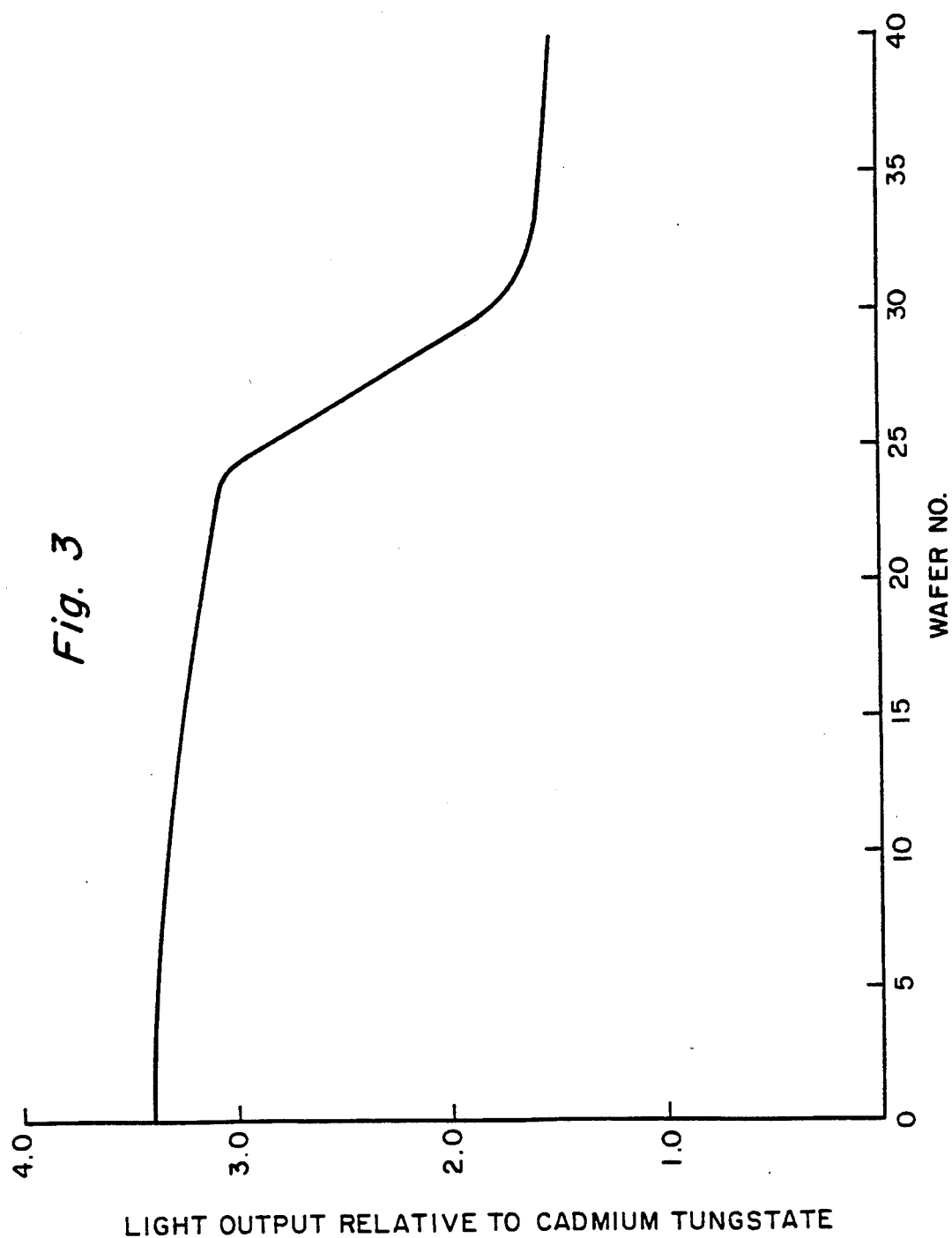
FIG. 3 is a graph of light output as a function of position along with the boule of chromium doped GGG.
Figure 4:
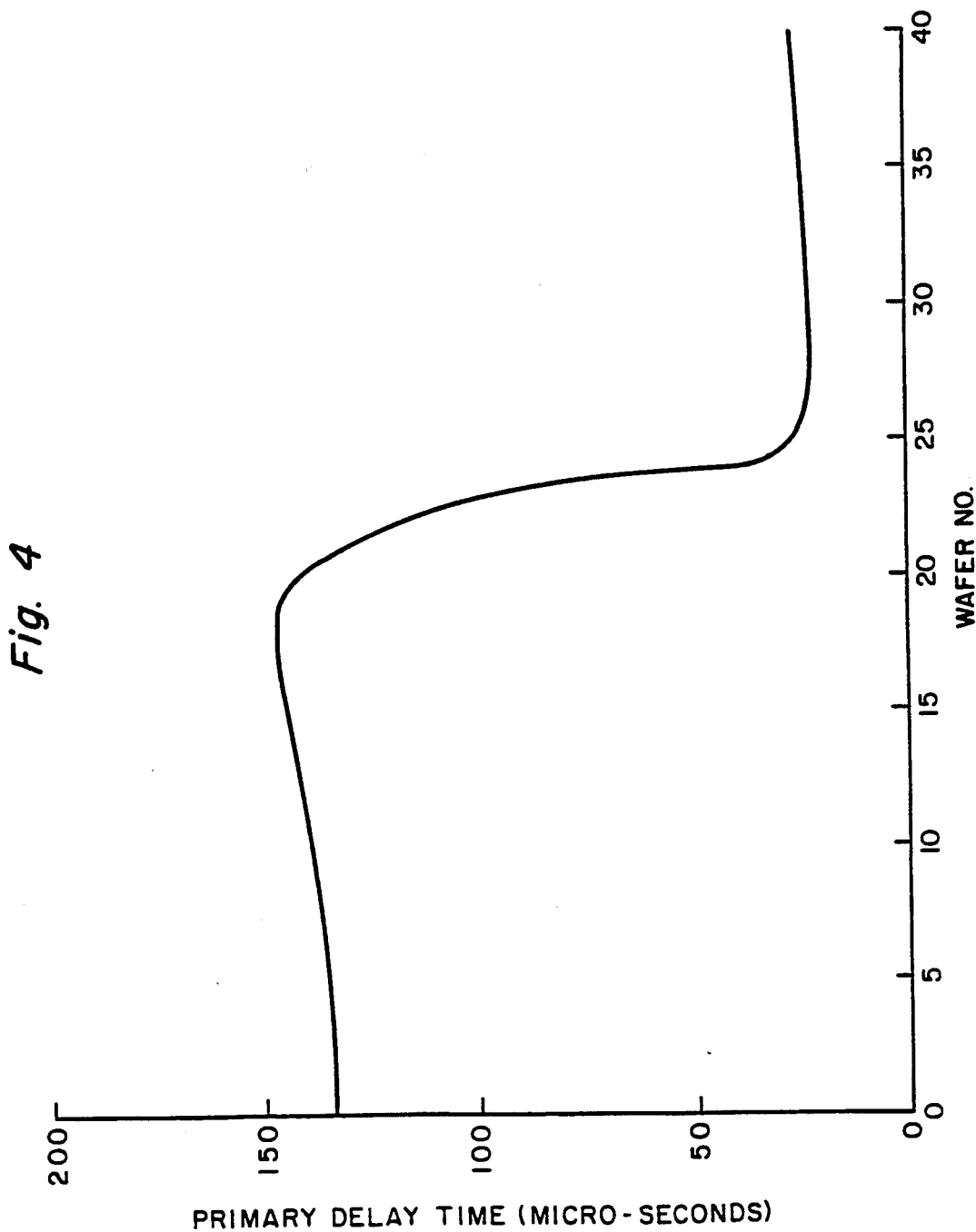
FIG. 4 is a graph of the primary decay time as a function of position along the boule of chromium doped GGG.

A boule of this chromium doped GGG was grown by the Czochralski method and was substantially 4 centimeters in diameter and 8 centimeters long. This boule had a generally hexagonal cross-section and was green in color as a result of the chromium doping. This boule was sliced into 40 wafers, each substantially 1 millimeter thick. These slices or wafers were numbered 1 at the top of boule as grown and 40 at the bottom of the boule with the numbers progressing monotonically from top to bottom. The average chromium concentration ranged from 0.22 wt% $Cr_2O_3$ in wafer 1 at the top of the boule down to 0.07 wt% $Cr_2O_3$ in wafer 40 at the bottom of the boule. This concentration as a function of wafer position is shown graphically in FIG. 2. This difference in concentration is a result of the chromium ion having a segregation coefficient in the range of from 3 to 4 in the GGG. At wafer 1 of the boule, the light output in response to x-ray stimulation (140 Kvp x-rays) was substantially 3.4 times the light output provided by cadmium tungstate and at the bottom of the boule in wafer 40 was about 1.52 times that of cadmium tungstate as shown graphically in FIG. 3. The primary decay time (upon cessation of x-ray stimulation) was in the vicinity of 140–160 microseconds in the wafers at the top of the boule and about 28 microseconds in wafer 40 at the bottom of the boule. The pattern of primary decay as a function of wafer position is illustrated graphically in FIG. 4.

Figure 5:
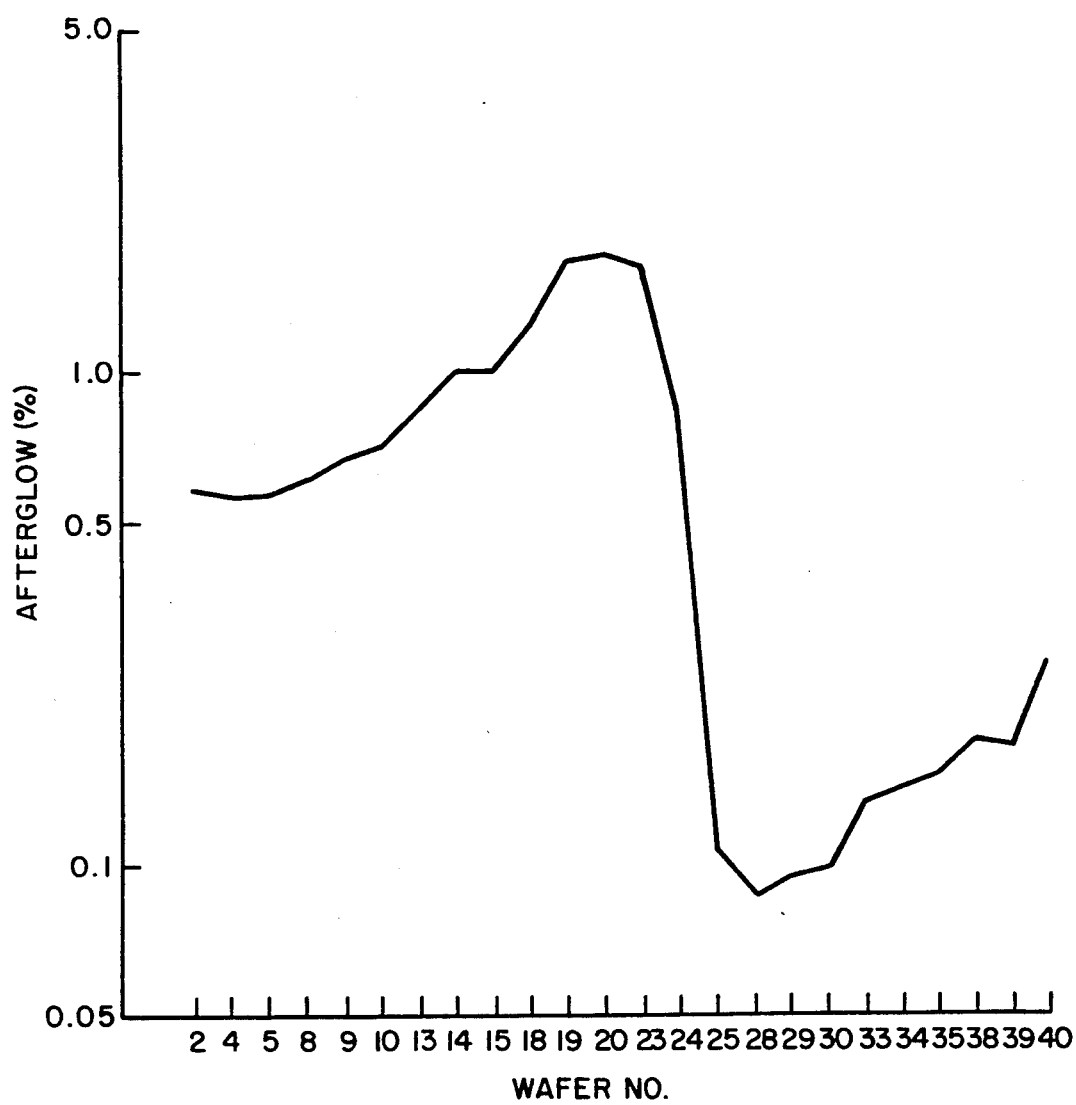
FIG. 5 is a graph of the afterglow as a function of position along the boule of chromium doped GGG.

The afterglow characteristic of this material (x-ray stimulation) is illustrated in graphical form in FIG. 5 where it can be seen that the afterglow for wafer 2 had a value of ~0.6% and increased with distance down the boule until the middle portion of the boule where a rapid decrease in the afterglow took place, after which the afterglow increased the rest of the way to the bottom of the boule.

The x-ray radiation damage in this boule was relatively high at the top and bottom ends of the boule and difficult to measure reliably because of ongoing emission caused by afterglows greater than ~0.2%. However, the radiation damage was relatively low in the middle of the boule and ranged in magnitude from about 1% to about 3%.

Figure 6:
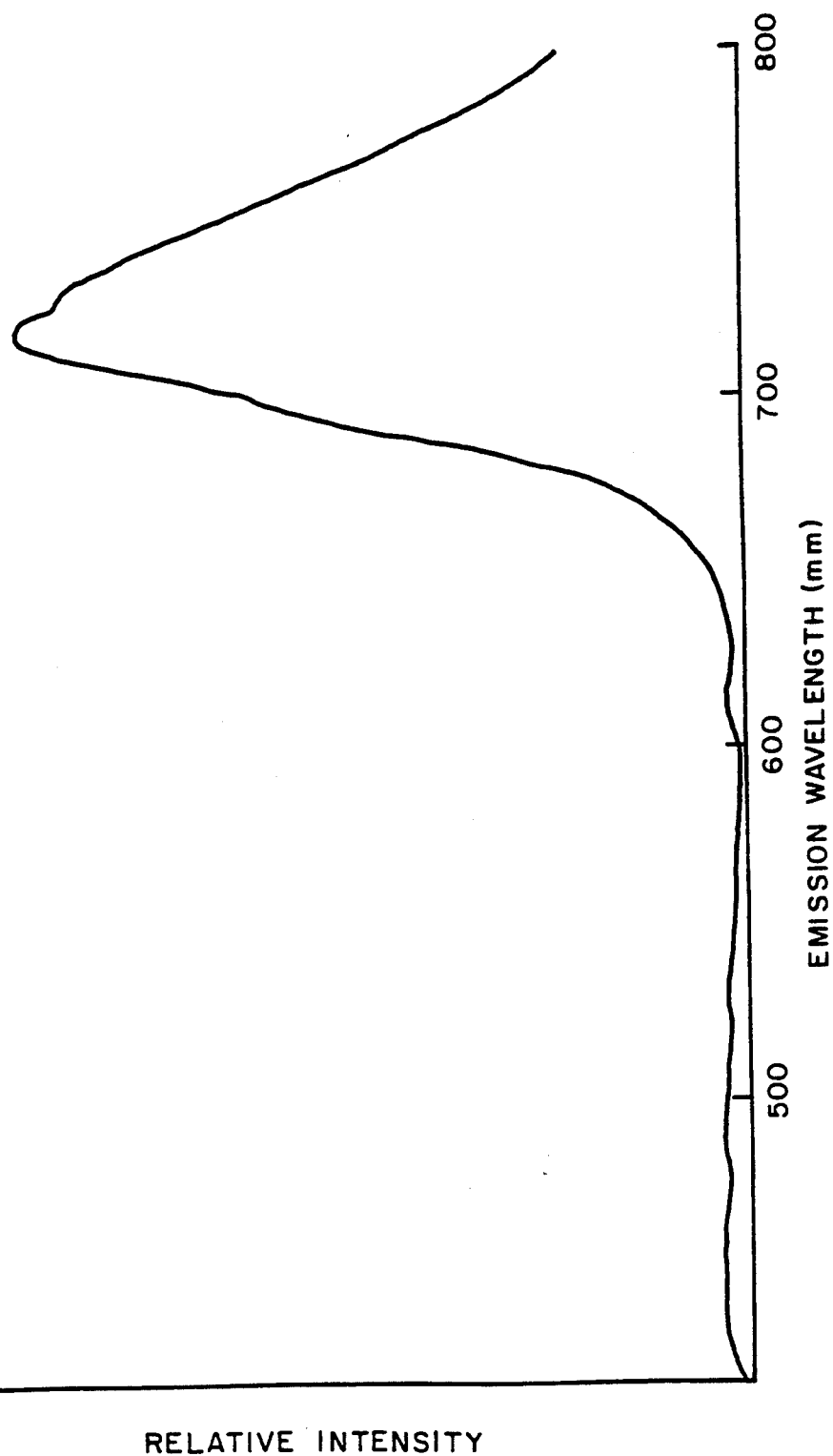
FIG. 6 is a graph of the luminescent spectrum of a chromium doped GGG.

The luminescent spectrum for this material is shown in FIG. 6. The shape of the spectrum was typical of any wafer from the boule. The maximum of the peak emission is centered at about 720 nm with more than 90% of its emitted energy in the 650 nm to 800 nm range.

The chromium concentration in the individual wafers was not uniform across the wafer as a result of the segregation coefficient for chromium and the fact that the growing face of the boule is not planar. However, high quality properties for this material are present in certain parts of the boule with truly superior characteristics being present in the middle and lower portions of the boule extending from about wafer 24 to about wafer 40.

Figure 7:
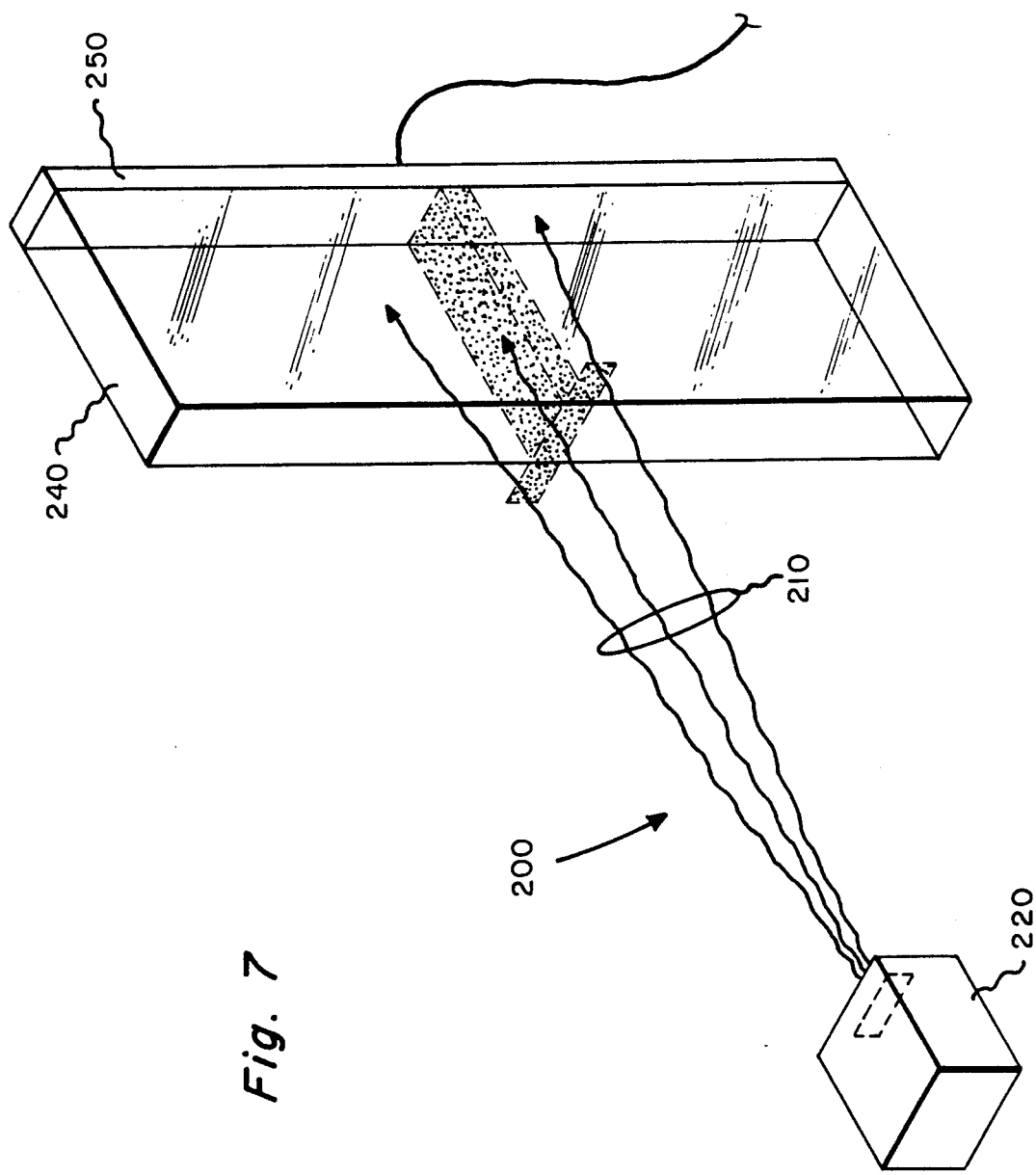
FIG. 7 is an illustration of test set up for measuring the Z-axis characteristics of a scintillator bar.
Figure 8:
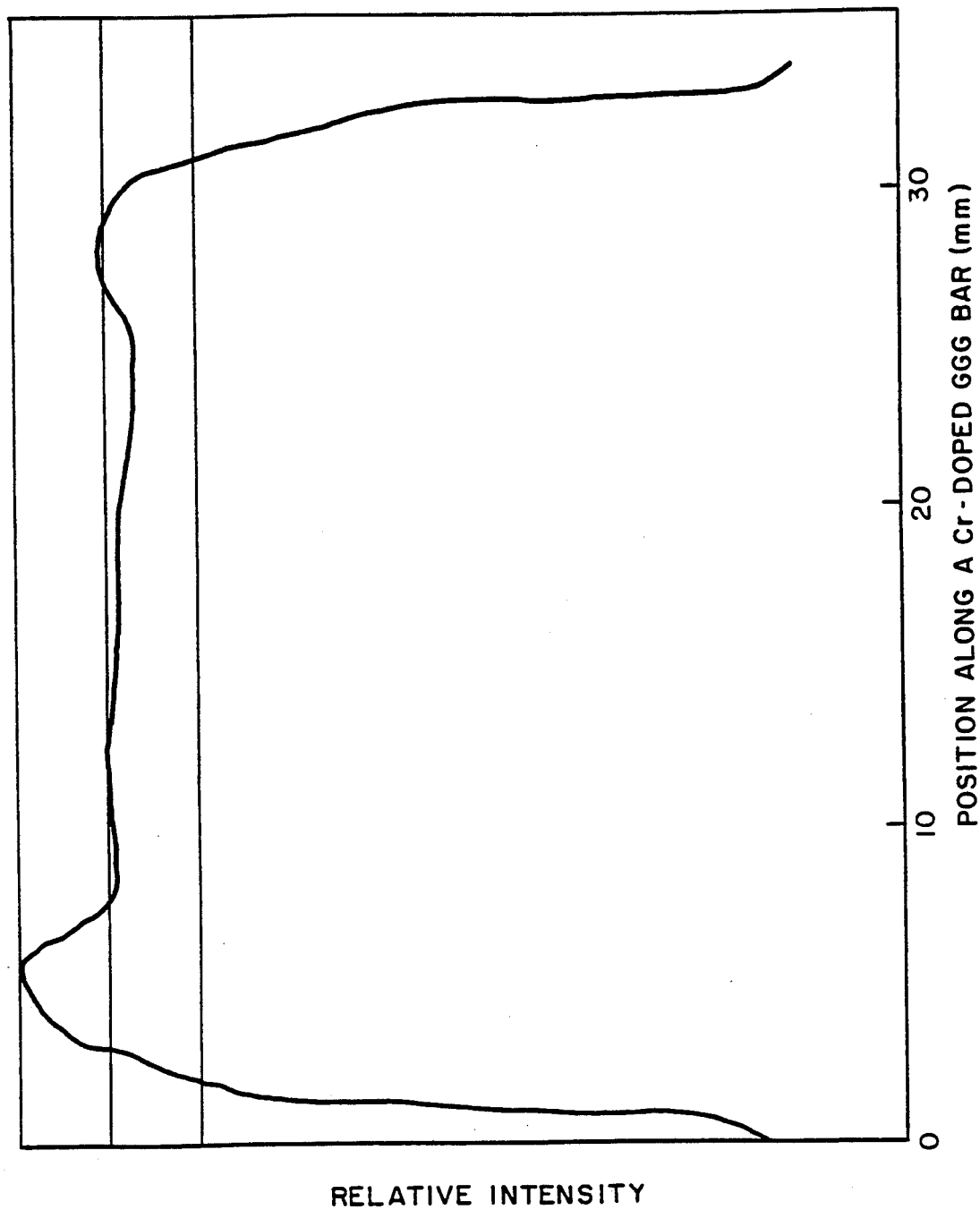
FIG. 8 is a graph of the Z-axis characteristics of a particular scintillator bar.

Several wafers from this boule were sliced into a plurality of scintillator bars whose characteristics were then measured, especially for Z-axis characteristics. The Z-axis characteristics were measured using the test setup 200 illustrated schematically in FIG. 7 in which a fan x-ray beam 210 from a source 220 was scanned the length of the bar 240 while the output from the photodiode 250 was measured and recorded. The Z-axis characteristics for a typical scintillator bar from wafer 11 of the boule is shown in FIG. 8. As seen in FIG. 8, the 33 mm long bar typically had higher light output just inboard from the ends of the bars than across the remaining central portion of the bars because of the higher chromium concentration in the peripheral portion of the wafer from which the bar was fabricated. Scintillator bars having substantially flat output may be provided by slicing about 7 mm off each end of the bar, thereby shortening the bar. If longer bars are desired with flat light output characteristics, they can be provided by growing a larger diameter boule in order that, after removal of the ends of the bars, a substantially uniform chromium concentration will be provided along the length of a 33 mm long bar. Alternative techniques for providing a uniform chromium distribution within the bar may be annealing of the bars after slicing to cause chromium diffusion, growth of pure gadolinium gallium garnet and introduction of the chromium into the gadolinium gallium garnet by diffusion after slicing of the boule into scintillator bars or by ion implantation into the bar to increase concentration in low concentration regions followed by annealing for diffusion of the chromium and relaxation of stresses and lattice dislocations caused by the ion implantation.

Chromium distribution within the boule may alternatively be controlled by the addition of chromium to the melt to compensate for its consumption in the boule or by other modifications of the growth process.

In a second embodiment of this invention, the host material is gadolinium scandium gallium garnet $(Gd_3Sc_2Ga_3O_{12})$ activated with $Cr^{3+}$.

EXAMPLE

A boule of this material grown by the Czochralski method had uniform chromium distribution as a result of chromium having a segregation coefficient of substantially 1 in this host material. This material had a chromium concentration of 0.18 wt% $Cr_2O_3$ and exhibits a light output of about 200% of that of cadmium tungstate. Its afterglow was ~2% and its radiation damage had a magnitude of 12%. In tests (not ours) of this material for laser use, its primary decay time has been measured to be about 120 microseconds. The afterglow of this material is substantially improved by annealing the scintillator bar in an oxidizing atmosphere (~1% $O_2$ in argon) at a temperature in the range from 1,300° C. to 1,500° C. After annealing, the light output was essentially unchanged and afterglow decreased to about 1%.

In accordance with another embodiment of the invention, the host material is gadolinium scandium aluminum garnet $(Gd_3(Sc_2Al_3)O_{12})$ (GSAG) activated with $Cr^{3+}$.

EXAMPLE

A boule of this material doped with 0.08 wt % chromium oxide was grown by the Czochralski method. This boule had substantially uniform chromium distribution, a light output of 1.5 times that of cadmium tungstate, afterglow of 3.5 to 4%, ill-defined radiation damage values because of interference from high afterglow, and a primary decay time of 160 microseconds.

Each of these host materials GGG, GSGG and GSAG is advantageous for use as the scintillator in an x-ray system because the gadolinium content provides high x-ray stopping capability. The chromium activator is desirable because it provides a high light output which has its peak emission in the 600 nanometer to 800 nanometer range as shown in FIG. 6. These materials appear essentially non-luminescent to the naked eye, since the light emission is close to the near-infrared. However, as may be seen from the sensitivity curves for a diode photodetector shown in FIG. 9, this peak output is near the peak sensitivity of a diode photodetector, thereby maximizing its output signal.

A further host material is yttrium aluminum garnet $(Y_3Al_5O_{12})$ also known as YAG.

EXAMPLE

Figure 9:
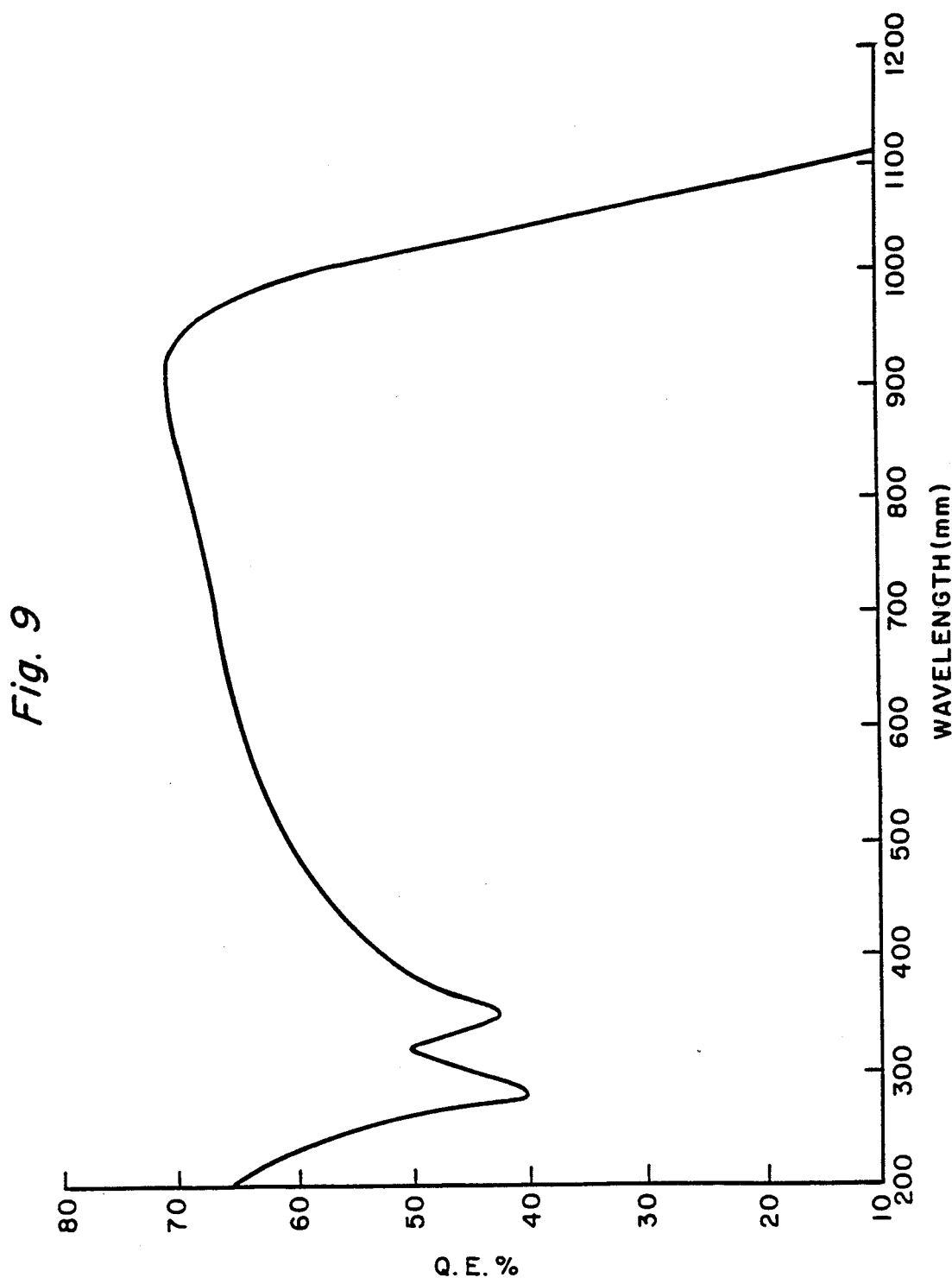
FIG. 9 is a graph of the quantum detection efficiency (spectral response) of a typical silicon PIN photodetector.
Figure 10:
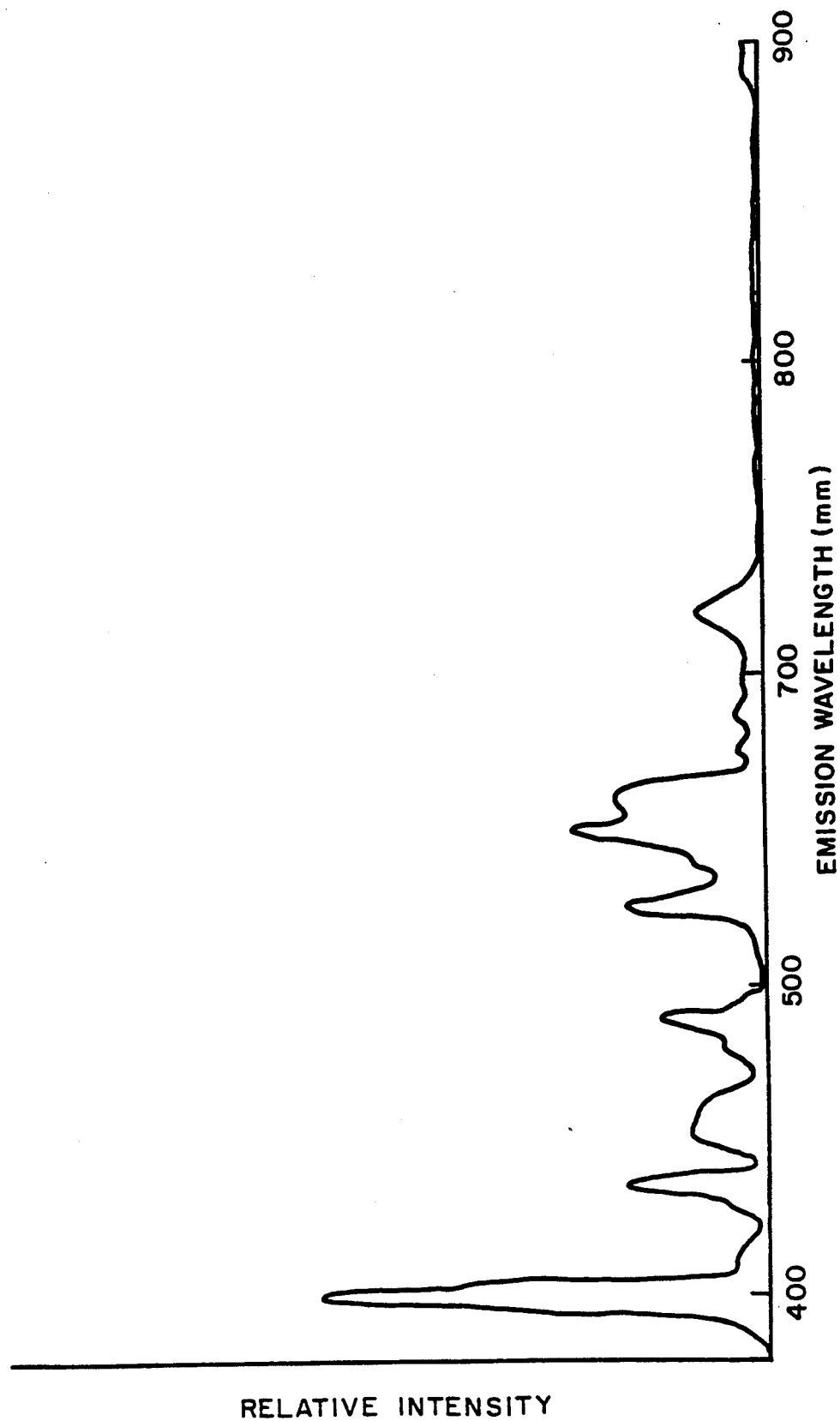
FIG. 10 is the luminescent spectrum of a neodymium doped YAG.

This host material was also Czochralski grown, was activated with 0.85 wt% neodymium oxide and provided a light output substantially equal to that provided by cadmium tungstate, had a primary decay time of about 300 microseconds, exhibited radiation damage of 0.3 to 0.7% and had an afterglow of 0.1 to 0.2%. The main emission from this scintillator material is at 1060 nanometers in the infrared portion of the spectrum out beyond the maximum response of the photodetector whose characteristics are illustrated in FIG. 9. However, it is well known that ~40% of the emitted energy occurs for a number of lesser peaks in the 400 nm–630 nm portion of the emission spectrum, as shown in FIG. 10.

EXAMPLE

Figure 11:
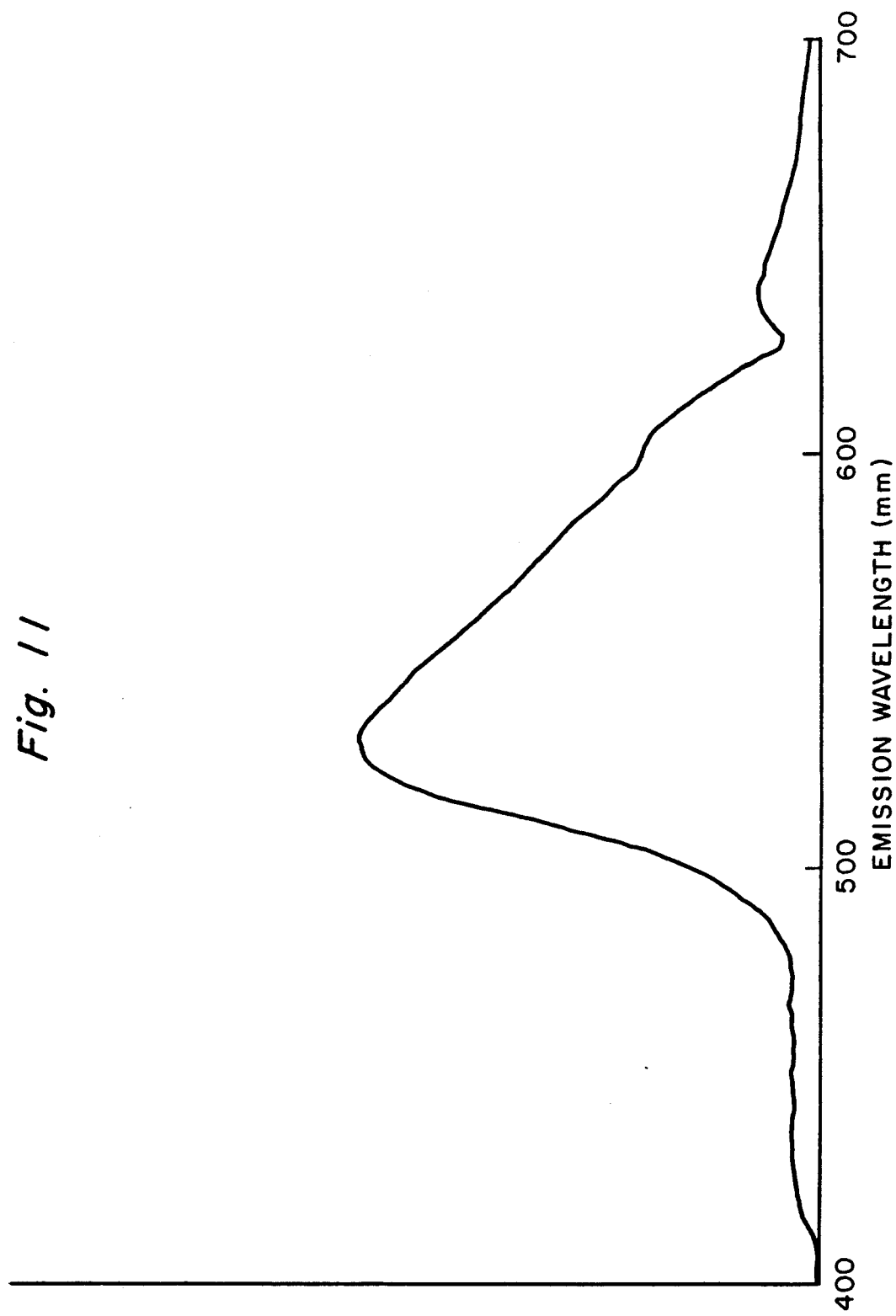
FIG. 11 is the luminescent spectrum of a cerium doped YAG.

A boule of yttrium aluminum garnet activated with 0.33 wt% cerium oxide was grown by Czochralski method. This boule provided a light output of substantially 153% of that of cadmium tungstate, had a primary decay time in the 60–70 nanosecond range, exhibited radiation damage in the 5–8% range and had an afterglow of about 0.01%. This scintillator material had a broad band emission output extending across the band from 480 nm to about 700 nm with a peak in the neighborhood of 530 nm as shown in FIG. 11.

In each of the examples described in this specification the scintillator material is single crystalline, however, it will be recognized that the luminescent properties of the material are characteristic of the material itself and thus, any of these scintillator materials is an appropriate material for use as the scintillator of a CT scanning machine in other forms than single crystalline, provided that the required transparency for the extraction of the luminescent light is present. Consequently, ceramic forms of these materials and these materials embedded in a transparent host material are also appropriate for use as the scintillator in a CT scanning machine.

Preparation of these materials as polycrystalline transparent bodies is disclosed in related applications Ser. No. 07/547,006 entitled "Transparent Polycrystalline Garnets" and Ser. No. 07/546,824 entitled "Hole-Trap-Compensated Scintillator Material". Therein, GGG activated with chromium oxide concentrations as high as 0.6 wt% have been demonstrated to be effective scintillators.

While particular host garnet materials have been described, as have particular activators, it should be recognized that this invention encompasses the use of garnet materials in general, and more particularly, gadolinium, lutetium (Lu) or ytterbium (Yb) containing garnets (because of their high x-ray stopping power) as the host material for a scintillator activated by chromium, cerium, neodymium or other appropriate activating ions to provide significant scintillator output in the visible to near infrared portion of the electromagnetic spectrum. A number of different scintillator materials may be fabricated in accordance with the present invention without departing from its appropriate scope.

Thus, we have shown that some cubic yttrium and rare earth garnet materials activated with chromium, cerium and neodymium on the eight-fold and six-fold coordinated sites of the lattice structure have excellent x-ray scintillator properties for use in CT scanning systems. It will be recognized that the properties of these materials may be modified by substitutions, thermal treatment and so forth. In particular, since x-ray luminescent activation with three different activators in two different crystallographic sites has been demonstrated, it is clear that the host material itself has good characteristics for use in scintillation detectors of the type used in CT scanning machines.

Thus, scintillator materials in accordance with the present invention, when utilized in CT scanning systems such as that illustrated schematically in FIG. 1, enable substantial improvements in the speed and resolution of such systems thereby enabling further advances in the CT scanning art.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A x-ray scintillator comprising:
   a transparent bar of a garnet host material;
   said garnet host material having an activator distributed in the host structure, said scintillator being selected from the group consisting of gadolinium gallium garnet, gadolinium scandium gallium garnet and gadolinium scandium aluminum garnet, each activated with chromium and yttrium aluminum garnet activated with cerium or neodymium.

2. The scintillator recited in claim 1 wherein:
   said garnet host material is single crystalline.

3. The scintillator recited in claim 1 wherein said garnet host material is gadolinium gallium garnet and said activator is chromium.

4. The scintillator recited in claim 3 wherein said chromium is present in a concentration between 0.05 wt% and 0.6 wt% chromium oxide in the total scintillator composition.

5. The scintillator recited in claim 1 wherein:
   said garnet host material is gadolinium scandium gallium garnet and said activator is chromium.

6. The scintillator recited in claim 1 wherein:
   said garnet host material is gadolinium scandium aluminum garnet and said activator is chromium.

7. The scintillator recited in claim 1 wherein:
   said garnet host material is yttrium aluminum garnet and said activator is cerium.

8. The scintillator recited in claim 1 wherein:
   said garnet host material is yttrium aluminum garnet and said activator is neodymium.

9. The scintillator recited in claim 1 wherein:
   said scintillator has a primary decay time of less than 500 microseconds in response to x-ray stimulation and an afterglow of less than 0.2% at 100 milliseconds after cessation of x-ray stimulation.

10. The scintillator recited in claim 9 wherein the main spectral peak of the scintillator is between 650 nm and 800 nm.

11. The scintillator recited in claim 10 wherein at least 70% of the energy in its luminescent light is in the 650 nm to 850 nm portion of the spectrum.

12. The scintillator recited in claim 1 wherein the main spectral peak of the scintillator is between 650 nm and 800 nm.

13. The scintillator recited in claim 12 wherein at least 70% of the energy in its luminescent light is in the 650 nm to 800 nm portion of the spectrum.

14. The scintillator recited in claim 1 wherein:
   said activator is chromium and said chromium is present in a concentration between 0.05 wt% and 0.6 wt% chromium oxide in the total scintillator composition.

15. The scintillator recited in claim 14 wherein:
   said chromium concentration is between 0.05 wt% and 0.22 wt%.

16. An x-ray scintillation detector element comprising:
   a solid transparent body comprising a garnet host material selected from gadolinium, ytterbium and lutetium garnets and including an activator selected from chromium and neodymium for producing luminescent light in response to x-ray stimulation;
   a photodetector disposed to receive luminescent light from said body; and
   means for reflecting luminescent light toward said photodetector.

17. The scintillation detector element recited in claim 16 wherein said luminescent material has more than 50% of the energy of its luminescent output at a wavelength longer than 700 nm.

18. The scintillation detector element recited in claim 16 wherein:
   said host material is a gadolinium garnet; and
   said activator is chromium.

19. The scintillation element recited in claim 18 wherein:
   said host material is selected from the group consisting of gadolinium gallium garnet, gadolinium scandium gallium garnet and gadolinium scandium aluminum garnet.

20. A scintillation detection system for providing extremely uniform response comprising:

a plurality of scintillator detection elements;

each of said scintillation detector elements including a photoresponsive detector for converting luminescent light to an electrical signal; and each of said scintillator detection elements comprising a gadolinium, ytterbium or lutetium garnet host material including a chromium or neodymium luminescent activator distributed throughout said garnet host structure.

21. The scintillation detector system recited in claim 20 wherein:

said scintillation detection elements are arranged in a substantially linear array.

22. The scintillation detector element recited in claim 20 wherein said luminescent material has more than 50% of the energy of its luminescent output at a wavelength longer than 700 nm.

23. The scintillation detector element recited in claim 20 wherein:

said host material is a gadolinium garnet; and said activator is chromium.

24. The scintillation element recited in claim 23 wherein:

said host material is selected from the group consisting of gadolinium gallium garnet, gadolinium scandium gallium garnet and gadolinium scandium aluminum garnet.

25. In a system of the type employing an x-ray luminescent material to convert incident x-ray radiation to visible or near visible radiation, the improvement comprising:

said x-ray luminescent material being a garnet having the general formula $A_3B_5O_{12}$ in which in any given composition either A or B or both may comprise more than one element, said garnet being activated with an activator selected from the group consisting of chromium plus three ions situated on six-fold B cation sites and neodymium plus three ions situated on eight-fold A cation sites.

26. The improvement recited in claim 25 wherein:

said garnet is a rare earth garnet in which the A cation, or a portion of it, is a rare earth ion.

* * * * *